United States Patent
Pischler

(10) Patent No.: US 8,888,504 B2
(45) Date of Patent: Nov. 18, 2014

(54) MULTILEVEL INTERCONNECTION SYSTEM

(75) Inventor: Erich Pischler, Graz (AT)

(73) Assignee: NXP B.V., Eindhoven (NL)

( * ) Notice: Subject to any disclaimer, the term of this patent is extended or adjusted under 35 U.S.C. 154(b) by 86 days.

(21) Appl. No.: 13/264,892

(22) PCT Filed: Mar. 26, 2010

(86) PCT No.: PCT/IB2010/051328
§ 371 (c)(1),
(2), (4) Date: Oct. 17, 2011

(87) PCT Pub. No.: WO2010/122437
PCT Pub. Date: Oct. 28, 2010

(65) Prior Publication Data
US 2012/0045909 A1 Feb. 23, 2012

(30) Foreign Application Priority Data
Apr. 20, 2009 (EP) .................................... 09158292

(51) Int. Cl.
| | |
|---|---|
| *H01R 12/00* | (2006.01) |
| *H01L 23/00* | (2006.01) |
| *H05K 1/18* | (2006.01) |
| *H01L 23/498* | (2006.01) |
| *H05K 1/02* | (2006.01) |
| *H01R 24/40* | (2011.01) |
| *H01R 103/00* | (2006.01) |
| *H01R 24/38* | (2011.01) |

(52) U.S. Cl.
CPC ................ *H01L 24/10* (2013.01); *H01L 24/72* (2013.01); *H05K 2201/09845* (2013.01);

(58) Field of Classification Search
CPC ...... H01R 23/725; H01R 13/64; H01R 23/10; H01R 23/02; H01R 13/44; H01R 13/26
USPC ............................................. 439/74; 257/678
See application file for complete search history.

(56) References Cited

U.S. PATENT DOCUMENTS

| | | | | |
|---|---|---|---|---|
| 5,127,838 A | * | 7/1992 | Zaderej et al. | ................... 439/74 |
| 5,266,912 A | * | 11/1993 | Kledzik | ........................ 333/247 |

(Continued)

FOREIGN PATENT DOCUMENTS

| | | |
|---|---|---|
| EP | 0 898 311 A2 | 2/1999 |
| JP | 2000 252381 A | 9/2000 |
| JP | 2006 060077 A | 3/2006 |
| WO | 02/13253 A1 | 2/2002 |
| WO | 2006024900 A1 | 3/2006 |

OTHER PUBLICATIONS

Search Report for International Patent Appln. No. PCT/IB2010/051328 (Oct. 28, 2010).

* cited by examiner

*Primary Examiner* — Amy Cohen Johnson
*Assistant Examiner* — Vladimir Imas

(57) ABSTRACT

A male connection component (120) for connection with a correspondingly configured female connection component (140) having a recess (144) extending into a main surface (170) of a female Substrate (142) of the female connection component (140), wherein the female connection component (140) comprises a plurality of electrically conductive female contacts (146) which are electrically decoupled from one another and are arranged at different height levels with regard to the main surface (170) of the female Substrate (142), the male connection component (120) comprising a male Substrate (102), a Protrusion (104) protruding from a main surface (160) of the male Substrate (102) and comprising a plurality of electrically conductive male contacts (106) which are electrically decoupled from one another and are arranged at different height levels with regard to the main surface (160) of the male Substrate (102), wherein the male connection component (120) is adapted for connection with the female connection component (140) so that upon connection, each of the plurality of electrically conductive male contacts (106) is brought in contact with one of the plurality of electrically conductive female contacts (146) for providing electric contactation at different height levels, wherein the male Substrate (102) forms at least part of one of a chip, a chip package and a circuit board.

20 Claims, 3 Drawing Sheets

(52) U.S. Cl.
CPC ......... *H05K 1/0298* (2013.01); *H01L 2924/014* (2013.01); *H01L 2924/01015* (2013.01); *H01L 2224/05578* (2013.01); *H01L 2924/14* (2013.01); *H01L 2924/01005* (2013.01); *H01L 2924/01032* (2013.01); *H01L 2224/16237* (2013.01); *H01L 2224/90* (2013.01); *H01L 2224/83136* (2013.01); *H01R 24/40* (2013.01); H05K 1/184 (2013.01); *H01L 2924/01033* (2013.01); H05K 1/0243 (2013.01); H01L 23/49811 (2013.01); *H01L 2224/13099* (2013.01); *H01L 24/90* (2013.01); *H01L 24/83* (2013.01); *H01L 2924/01029* (2013.01); *H01L 2224/83851* (2013.01); *H01L 2924/01082* (2013.01); *H01L 2224/13078* (2013.01); *H01R 2103/00* (2013.01); *H01L 2924/10253* (2013.01); *H05K 2201/09036* (2013.01); *H01L 2223/6622* (2013.01); *H05K 2201/092* (2013.01); *H05K 2201/09809* (2013.01); *H01L 2924/01023* (2013.01); *H01L 2924/01076* (2013.01); *H01R 23/26* (2013.01)
USPC .......................................................... 439/74

(56) References Cited

U.S. PATENT DOCUMENTS

| | | | | |
|---|---|---|---|---|
| 5,380,211 | A * | 1/1995 | Kawaguchi et al. | 439/74 |
| 5,477,612 | A * | 12/1995 | Roberts | 29/846 |
| 5,612,657 | A * | 3/1997 | Kledzik | 333/247 |
| 5,727,956 | A * | 3/1998 | Mitra et al. | 439/74 |
| 5,798,567 | A * | 8/1998 | Kelly et al. | 257/723 |
| 6,129,559 | A | 10/2000 | Hirata et al. | |
| 6,288,906 | B1 * | 9/2001 | Sprietsma et al. | 361/772 |
| 6,555,015 | B1 * | 4/2003 | Dailey et al. | 216/17 |
| 6,589,870 | B1 * | 7/2003 | Katoh | 438/690 |
| 6,663,440 | B2 * | 12/2003 | Cox et al. | 439/700 |
| 6,739,027 | B1 * | 5/2004 | Lauffer et al. | 29/25.42 |
| 7,762,819 | B2 * | 7/2010 | Mori et al. | 439/66 |
| 2002/0005591 | A1 | 1/2002 | Lin | |
| 2004/0007774 | A1 | 1/2004 | Crane, Jr. et al. | |
| 2004/0173894 | A1 | 9/2004 | Glenn et al. | |
| 2004/0214457 | A1 * | 10/2004 | Ma | 439/74 |
| 2006/0097370 | A1 * | 5/2006 | Bartley et al. | 257/678 |
| 2006/0170112 | A1 | 8/2006 | Tanaka et al. | |
| 2007/0128845 | A1 | 6/2007 | Hsu et al. | |
| 2007/0235215 | A1 | 10/2007 | Bathan et al. | |

# MULTILEVEL INTERCONNECTION SYSTEM

FIELD OF THE INVENTION

The invention relates to a male connection component.
The invention further relates to a female connection component.
Moreover, the invention relates to an electronic apparatus.
Furthermore, the invention relates to a method of connecting a male connection component with a female connection component.

BACKGROUND OF THE INVENTION

For instance for packaging semiconductor chips and for connecting the packaged semiconductor chip to a printed circuit board, a number of electric contacts has to be made. The ability to provide more and more I/O interconnections to a die (bare chip) that is increasingly shrinking in size is an important issue. In addition, the smaller size of the package contributes as much to the miniaturization of cellphones and other handheld devices as the shrinking of the semiconductor circuits.

WO 02/13253 discloses a method of producing a female microconnector for connection to a microcomponent having a corresponding male connector, the method comprising the steps of depositing a first layer on a substrate, removing a selected portion of the first layer, and removing a selected portion of the substrate to define a recess having an opening in the substrate with one or more portions of the first layer partially extending over the opening of the recess, the material and thickness of the first layer selected such that when a corresponding male connector is inserted into the recess, the one or more portions of the first layer extending over the opening of the recess flex to hold the male connector in the desired position within the recess, wherein the selected portion of the substrate is removed by a first etching process using a first etchant to undercut the first layer, the etch period of the first etching process being selected to etch a first width sufficient to allow the first layer to flex, and a second etching process using a second etchant different to the first etchant to etch to a second width to undercut the first layer, the etch period of the second etching process being selected so that the second width is less than the first width, wherein the etch rate of the second etching process normal to the plane of the first layer is greater than the etch rate parallel to the plane of the first layer.

However, conventional connection techniques do not allow to provide a sufficient number of contacts when pieces to be connected become smaller and smaller.

OBJECT AND SUMMARY OF THE INVENTION

Hence, it is an object of the invention to enable connection of two components allowing to make a sufficient number of electric contacts.

The object of the invention is achieved by a male connection component, a female connection component, an electronic apparatus, and a method of connecting a male connection component with a female connection component according to the independent claims.

According to an exemplary embodiment, a male connection component is provided for connection with a correspondingly configured female connection component having a recess (such as a trench) extending into a main surface (for instance a planar surface portion) of a female substrate of the female connection component, wherein the female connection component comprises a plurality of electrically conductive female contacts (which may be exposed to an environment at lateral positions within the recess) which are electrically decoupled from one another and are arranged at different height levels (within the recess) with regard to the main surface of the female substrate, the male connection component comprising a male substrate, and a protrusion protruding from a main surface of the male substrate and comprising a plurality of electrically conductive male contacts which are electrically decoupled from one another and are arranged at different height levels (or elevation levels or altitudes, i.e. at different distances from the main surface of the male substrate) with regard to the main surface of the male substrate, wherein the male connection component is adapted for connection with the female connection component so that upon connection, each of the plurality of electrically conductive male contacts is brought in contact with one of the plurality of electrically conductive female contacts for providing electric contacting at different height levels, wherein the male substrate forms at least part of one of a chip, (such as an electronic chip, particularly an integrated circuit) a chip package and a circuit board (such as a substrate for carrying the chip or chip package, which circuit board may be a printed circuit board or a further chip to be mounted directly which the chip).

According to another exemplary embodiment, a female connection component is provided for connection with a correspondingly configured male connection component having a protrusion protruding from a main surface (for instance a planar surface portion) of a male substrate of the male connection component, wherein the male connection component comprises a plurality of electrically conductive male contacts (which may be exposed to an environment at a lateral boundary of the protrusion) which are electrically decoupled from one another and are arranged at different height levels (on the protrusion) with regard to the main surface of the male substrate, the female connection component comprising a female substrate, and a recess extending into a main surface of the female substrate and delimiting a plurality of electrically conductive female contacts of the female substrate which are electrically decoupled from one another and are arranged at different height levels (or elevation levels or altitudes, i.e. at different distances from the main surface of the female substrate) with regard to the main surface of the female substrate, wherein the female connection component is adapted for connection with the male connection component so that upon connection, each of the plurality of electrically conductive male contacts is brought in contact with one of the plurality of electrically conductive female contacts for providing electric contactation at different height levels, wherein the female substrate forms at least part of one of a circuit board, a chip and a chip package.

According to still another exemplary embodiment, an electronic apparatus (such as a mobile phone or another portable device) is provided which comprises a male connection component having the above mentioned features and a female connection component having the above mentioned features, wherein the male connection component is connected with the female connection component, wherein one of the male substrate and the female substrate forms at least part of the chip or the chip package, and the other one of the male substrate and the female substrate forms at least part of the circuit board.

According to yet another exemplary embodiment, a method of connecting a male connection component with a female connection component is provided, wherein the method comprises providing the male connection component with a male substrate and a protrusion protruding from a main surface of the male substrate and comprising a plurality of electrically conductive male contacts which are electrically decoupled from one another and are arranged at different height levels with regard to the main surface of the male substrate, providing the female connection component with a female substrate and a recess extending into a main surface of the female substrate and delimiting a plurality of electrically conductive female contacts of the female substrate which are electrically decoupled from one another and are arranged at different height levels with regard to the main surface of the female substrate, and connecting the male connection component with the female connection component so that upon connection, each of the plurality of electrically conductive male contacts is brought in contact with one of the plurality of electrically conductive female contacts for providing electric contactation at different height levels (for electrically connecting the male connection component with the female connection component), wherein one of the male substrate and the female substrate forms at least part of a chip or a chip package, and the other one of the male substrate and the female substrate forms at least part of a circuit board.

The term "substrate" may denote any suitable material, such as a semiconductor like silicon, a dielectric material like glass or plastic, or a metal or metallic foil. According to an exemplary embodiment, the term "substrate" may be used to define generally the elements for layers that underlie and/or overlie a layer or portions of interest. Also, the substrate may be any other base on which layers may be formed or a component is to be mounted.

The term "main surface" of the substrates may particularly denote a planar surface portion of the substrate, particularly one which is commonly used for processing the substrate (for instance for forming structures thereon or for forming trenches therein).

The term "chip package" may particularly denote a housing that chips come in for plugging into (socket mount) or soldering onto (surface mount) a circuit board such as a printed circuit board, thus creating a mounting for a chip. In electronics, the term chip package or chip carrier may denote the material added around a component or integrated circuit to allow it to be handled without damage and incorporated into a circuit.

The term "circuit board" may particularly denote a support or mounting base on which a packaged chip such as a semiconductor chip is to be mounted. More particularly, printed circuit boards may be denoted as circuit boards comprising an insulator (for instance fiberglass), with threads of electrically conductive material serving as wires on the base of the board. The insulator may comprise one or numerous layers of material glued into a single entity. These additional layers may serve for a number of purposes, including providing grounding to the board. A printed circuit board, or PCB, may be used to mechanically support and electrically connect electronic components using conductive pathways, or traces, etched from copper sheets laminated onto a non-conductive substrate. A circuit board may also be a printed wiring board (PWB) or an etched wiring board.

According to an exemplary embodiment of the invention, a connection kit is provided which allows for a simple, small-size, light-weight, multi-pin connection between a circuit board (such as a printed circuit board, PCB) and a chip package (such as a semiconductor chip package for holding a semiconductor chip). For this purpose, at least one protrusion of a male connection component is simply inserted into at least one corresponding recess of a female connection component so that multiple electric contacts arranged at different height levels of the protrusions are aligned in a mating way with corresponding contacts delimited by the at least one recess at different height levels. In other words, when a planar surface portion of a main substrate defines a horizontal plane, the male member and the female member make multiple electric connections in a vertical direction oriented normal to the horizontal plane. By using a third dimension for electric contact purposes, the number of pins or electrical contacts which are contactable to one another can be multiplied as compared to a two-dimensional arrangement. This may allow to connect an integrated circuit chip with a circuit board in a way that the number of connectable connection pins per area unit is significantly increased. This allows for a safe, simple and fast connection between male and female components in a way that the number of connected contacts is basically unlimited due to the introduction of a third dimension in the direction perpendicular to the main surface of the substrate.

An embodiment of the invention relates to fine-pitch integrated circuit package interconnects. Conventionally, there is a limit to the amount of input/output pins that may fit onto the surface of a chip due to bump size and pitch. An embodiment of the invention provides a three-dimensional interconnect comprising a pillar-like central connector surrounded by tube-like connectors. The three-dimensional male device of a chip package may be press-fit into the female device of a PCB board, resulting in multiple connections at different levels in the same space previously occupied by a solder bump. Hence, multilevel interconnections of a male-female type may be provided between chip packages and circuit boards. In an embodiment, some kind of multilevel interconnection using coaxial connectors may be made possible.

In the following, further exemplary embodiments of the male connection component will be explained. However, these embodiments also apply to the female connection component, to the electronic device and to the method.

In an embodiment, is it possible to provide a connection of an integrated circuit such as an electronic chip (semiconductor member) directly with a substrate. In other words, embodiments of the invention are not limited to chip package applications.

The protrusions may be manufactured by a bumping process (such as a galvanic or electroless bump procedure).

Appropriate electric connection positions of the male member are head sides of the protrusion(s). Alternatively, electric connection positions of the male member may be side surfaces of the protrusion(s). Also combinations between horizontal (or radial) contacts and vertical (or head sided) contacts are possible.

The male connection component may comprise a plurality, particularly an array (for instance a two-dimensional array), of protrusions protruding from the main surface of the male substrate and comprising a plurality of electrically conductive male contacts which are electrically decoupled from one another and are arranged at different height levels with regard to the main surface of the male substrate. Such an array may be particularly a matrix-like array of protrusions arranged in M rows and N columns. This may allow for a huge number of M×N×P pins to be connected with a vertical multipin configuration having P pins per protrusion/recess.

The protrusion may comprise a central pillar (for instance cylindrically shaped) and at least one tube (for instance hollow cylindrically shaped) surrounding (for example concentrically) the pillar protruding from the main surface of the male substrate. Pillar and tube(s) may comprise the plurality of electrically conductive male contacts and electrically insulating material for electrically decoupling the electrically conductive male contacts from one another. The central pillar may be a cylindrical or post-like structure comprising or consisting of an electrically conductive material such as a metal. This central pillar may protrude up to a maximum height from the male substrate and may also serve to give a user an intuitive orientation for a connection center between the male piece and the female piece. Concentrically arranged around this pillar may be the one or more tubular structure which allow to obtain a rotationally symmetric geometry. Each tube may comprise an electrically conductive portion and an electrically insulating portion. An arrangement of the electrically conductive portions and the electrically insulating portions of the tubes may be such that upon connection of the male connection component and the female connection component, each of the electrically conductive portions is electrically contacted with a dedicated corresponding one of electrically conductive portions of the female connection components. The dielectric portions sandwiched in between may allow to prevent undesired crosstalk or undesired electrical connections between different contacts.

Bumps, tubes and holes may be round and symmetric, for an easy connection. A cone form can be applied for an even easier connecting step.

Also asymmetric shapes are possible which have the advantage of defining a preferential orientation for assembly to prevent a false connection of the contacts. This can also be realized by an aligning additional male-female connection spatially apart from a remaining connection matrix.

The central pillar may extend to a height which is larger than a height up to which the at least one tube extends to thereby form a tapering structure, particularly a stepped tapering structure (compare FIG. 3). With such a configuration, an "arrow" shaped protrusion may be formed which gives a user an intuitive indication as to how to connect the protrusion properly with a correspondingly shaped recess of the female connection component. With such a tapering structure, a portion extending to a maximum height away from the male substrate is adapted to make electric contact with a bottom portion of the recess. The tubes which are arranged around the central pillar may extend to a continuously decreasing height so that in a cross-sectional view a step-like or stair-like geometry is obtained. As an alternative to a tubular structure, it is also possible to provide a structure which has the shape of a rectangle (or more generally of a polygon) with a certain wall thickness. In such a scenario, the pillar can also have a rectangular, for instance square-like (or more generally polygonal) cross section.

An advantage of a tapered structure of protrusions is a very reliable electric contact. This particularly holds for an embodiment in which the individual contact positions have different diameter (for instance, an outermost contact may have the smallest diameter, whereas a central or innermost contact may have the largest diameter). In such an embodiment, the innermost contact should sit deeply in a corresponding recess, whereas the sequence of outer protrusions sit with a continuously decreasing deepness in corresponding recesses, however still ensuring a reliable contact for each engagement pair.

The protrusion may comprise a plurality of electrically conductive structures and a plurality of electrically insulating structures formed by lamination. A laminate may denote a material composed of successive layers or structures of material, for instance bonded together for example under heat and/or pressure or by using glue. By laminating different layers to one another (some of the layers being formed of electrically conductive materials such as copper and some of the layers being formed of electrically insulating material), the male connection component and particularly the protrusion or protrusions thereof can be manufactured in a cheap way simultaneously obtaining a high degree of spatial accuracy.

The male substrate may be or may be part of a wafer level chip scale package (WLCSP) for packaging a semiconductor chip. Such a semiconductor chip may be particularly a silicon chip formed by microtechnology. As an alternative to silicon technology, any other group IV semiconductor technology may be used such as germanium technology. It is also possible that a group III group V semiconductor technology such as gallium arsenide technology is used for forming at least part of the male connection component.

Manufacture of the members is possible by lamination and/or etching, wherein additionally or alternatively wafer processes (such as sputtering of metals, spin coating of insulator materials, subsequent etching and bumping procedures, galvanic or electroloess) can be performed as well. Also when performing such bumping procedures, coating and/or etching processes may be performed as well.

In the following, further exemplary embodiments of the female connection component will be explained. However, these embodiments also apply to the male connection component, to the electronic device and to the method.

The female connection element may comprise a plurality, particularly an array (for instance a two-dimensional array), of recesses extending into the main surface of the female substrate and delimiting (particularly laterally) a plurality of electrically conductive female contacts of the female substrate which are electrically decoupled from one another and are arranged at different height levels with respect to the main surface of the male substrate. In such an embodiment, the array of the recesses may correspond—regarding positions, dimensions and geometric properties—to the array of protrusions. Both the main surfaces of the male substrate and the female substrate may be planar surface portions which can contact one another upon simultaneously inserting the protrusions into the recesses.

The recess may comprise a central pillar-shaped recess portion (for instance cylindrically shaped) and at least one tube-shaped recess portion (for instance hollow cylindrically shaped) surrounding the pillar-shaped recess portion extending into the main surface of the female substrate and delimiting the plurality of electrically conductive female contacts and electrically insulating material of the female substrate for electrically decoupling the electrically conductive female contacts from one another. Thus, a correspondence of the pillar-tube arrangement of the male connection component with the hollow pillar-hollow tube arrangement of the recesses of the female connection component may be present.

The central pillar-shaped recess portion may extend to a height which is larger than a height up to which the at least one tube-shaped recess portion extends to thereby form a tapering structure, particularly a stepped tapering structure (compare FIG. 4). By such a step tapering, a reliable shape coding may be obtained preventing erroneous connection of male and female connection components to one another.

Also the female connection substrate may comprise a plurality of electrically conductive structures and a plurality of electrically insulating structures formed by lamination. Again, this allows for a simple and reliable production of the female connection component in accordance with the manufacture of the male connection component.

The female substrate may form at least part of a printed circuit board (PCB) for receiving a semiconductor chip. Therefore, the female connection component and the male connection component may simplify mounting of a semiconductor chip on a printed circuit board during or after packaging a semiconductor chip.

In an embodiment, it is also possible that a semiconductor chip is mounted on another semiconductor chip. In such an embodiment, it is possible that all connection elements of the members are formed by semiconductor processing technology, particularly silicon microtechnology.

Next, further exemplary embodiments of the electronic apparatus will be explained. However, these embodiments also apply to the male connection component, the female connection component and the method.

The electronic apparatus may comprise electrically conductive glue in a connection portion between the protrusion and the recess. Such an electrically conductive glue may serve simultaneously for mechanically adhering the two connection components to one another and also for promoting electrical contact between the electric portions brought in alignment to one another. This may allow to ensure a reliable connection even in a scenario in which tolerances of dimensions and shapes of the male and female connection components are present.

Further possibilities for a reliable contacting is a configuration of the dimensions of the male/female connections so that they do not match at room temperature. Upon heating or cooling of one or both members, one or both members may shrink or expand so that they can be connected to one another. Upon bringing the members again to room temperature after assembling them to one another, a press fit connection may automatically formed between them. Stress acting on such a connection may be sufficiently small and may be smaller as in case of a solder connection.

The device may form part of any electronic device, particularly may form part of a portable device. For instance, an embodiment may be or may be part of a microphone, a mobile phone, a headset, a headphone playback apparatus, a hearing aid, a gaming device, a laptop, an audio player, a DVD player, a CD player, a harddisk-based media player, a radio device, an internet radio device, an MP3 player, a medical communication system, a body-worn device, or a speech communication device. Other applications are possible as well.

Furthermore, by a corresponding or matching shape of the protrusion and the recess, a shape coding feature may be implemented which allows to connect the male connection component with the female connection component so that an erroneous connection may be avoided.

According to preferred embodiment, the male substrate forms at least part of a chip package and the female substrate forms at least part of a circuit board. It has turned out to be particularly advantageous to connect the protrusion to a semiconductor chip packaging unit, whereas the provision of recesses is appropriate for a surface portion of a printed circuit board. However, in an alternative embodiment, it is possible that the role of male and female substrates are reversed, i.e. the male substrate forms at least a part of a circuit board and the female substrate forms at least part of a chip package.

These and other aspects of the invention are apparent from and will be elucidated with reference to the embodiments described hereinafter.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
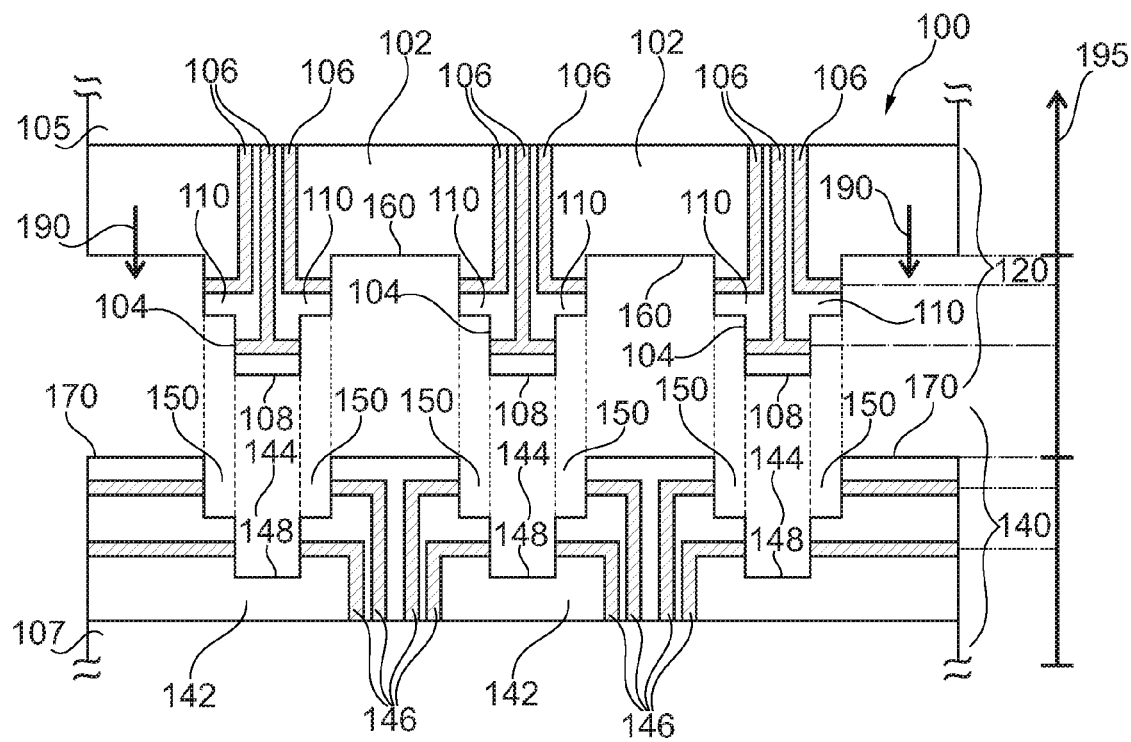
FIG. 1 illustrates a cross-sectional view of a male connection component and a mating female connection component according to an exemplary embodiment of the invention.

The illustration in the drawing is schematically. In different drawings, similar or identical elements are provided with the same reference signs.

In the following, such basic recognitions of the present inventor will be mentioned based on which exemplary embodiments of the invention have been developed.

Nowadays semiconductors manufacturers do apply BGA (ball grid array), QFN (Quad Flat No-Lead) and other leaded and leadless packages to provide a connectable semiconductor device to a system integrator (like a handheld manufacturer) who usually solders (or glues) the leads or contacts of the package, which are distributed two-dimensionally on the package, on a printed circuit board.

For WLCSP (wafer level chip scale packages), this two-dimensional arrangement of the interconnections (which can be bumps, leads, balls, etc.—herein shortly called bumps) restricts the maximum number of input/output connections (I/Os) on the WLCSP. The minimum bump size and the minimum pitch between the bumps defines the maximum quantity of I/Os on a certain chip size/area.

For example, a TFBGA (thin fine-pitch ball grid array) with body size 4.5×4.5 mm using a minimum pitch (that can be handled by the PCB manufacturer) of 0.5 mm and a ball size of 0.25 mm can provide a maximum number of 64 I/Os on the bottom surface. This means that a WLCSP of the same size would also be restricted to the same number of I/Os. Only by decreasing the pitch, which needs also a reduction of the bump size below a certain distance, it is possible to increase the number of I/Os that can be routed to the PCB.

A semiconductor chip (IC, integrated circuit) of a size of 4.5×4.5 mm can have much more I/Os than only 64. This difference in pin count could not be connected to the PCB, and could therefore not be used by an application. Alternatively, chip size may be increased which would increase costs and would not match with user requirements.

To solve this problem of restricted number of I/Os by the package I/O pitch (which is a constraint by the PCB manufacturer), the I/Os can be designed on a multi level according to an exemplary embodiment.

A package laminate can be manufactured by deposition/mask processes. The different level connections may be made by creating a pillar bump in the center and various layers of copper (or other conductive material) sequentially separated by insulation layers (core layers). The different levels can be connected to different bond fingers on the top surface of the package laminate which are then connected to the IC by wire bonding or other techniques.

The PCB (application side) needs to have the inverted form of the connector. Some mechanical tolerances of male and female part should be taken into account to provide a reliable connection. Additional conductive gluing can be performed for a reliable connection.

Some advantages which may be achieved by such a technique are:
- It can be easily applied, because for creation of these connectors on PCB and package laminate, simple processes can be used
- Additional materials (like solder balls or other bumps) are not needed resulting in a shorter value chain and a cheaper manufacturability
- Solder process of the components not needed, hence no pop-effect (cracking of plastic packages due to evaporation of moisture inside the plastic body)
- Less effort for testing of semiconductor devices/packages
- Less demands on package materials and PCB materials
- In general less stress on the semiconductor device during PCB assembly FIG. 1 illustrates part of a handheld device such as a mobile phone as an example for an electronic apparatus 100 according to an exemplary embodiment of the invention.

The electronic apparatus 100 comprises a male connection component 120 and a female connection component 140 which are shown in FIG. 1 before connection of the male piece 120 to the female piece 140 which can be performed by a motion of the male piece 120 relative to the female piece 140 in a direction as indicated by the arrows 190.

As indicated schematically with reference numeral 105, a male substrate 102 forms part of a semiconductor chip package, the semiconductor chip being mounted on top of the male connection component 120.

As can further be taken from FIG. 1, the female substrate 142 forms part of a printed circuit board (PCB) 107 to which the semiconductor chip package 105 is to be mounted.

The male connection component 120 comprises the male substrate 102 and protrusions 104 protruding from a planar main surface 160 of the male substrate 102. Each of the identical protrusions 104 comprises a plurality of electrically conductive male contacts 106 which are electrically decoupled from one another and are arranged at different height levels of the protrusion 104 with regard to the main surface 160 of the male substrate 102. The different height levels can be considered as different coordinates of the individual surface portions of the electrical connections 106 laterally exposed at the protrusions 104 on a vertical axis 195 shown in FIG. 1. The extension of the individual electrically conductive portions 106 to surface portions of the protrusion 104 may be calculated relative to the main surface 160 of the male connection component 120.

The male connection component 120 is adapted for connection with the female connection component 140 when the protrusions 104 are aligned to recesses 144 of the female connection component 140.

The female connection portion 140 comprises a female substrate 142 and the recesses 144 extending into a planar main surface 170 of the female substrate 142. At lateral portions thereof, the recesses 144 delimit or expose a plurality of electrically conductive female contacts 146 of the female substrate 142 which are electrically decoupled from one another and are arranged at different height levels with regard to the main surface 170 of the female substrate 142. The different height levels of the different electrically conductive surface portions forming the contacts 146 within each recess 144 can be seen on the vertical axis 195.

Upon connection of the male connection component 120 with the female connection component 140, each of the plurality of electrically conductive male contacts 106 is brought in contact with one of the plurality of electrically conductive female contacts 146 for providing electric contacts at different height levels.

Thus, when the male connection component 120 is lowered in the direction of arrows 190 so that the surface portions 160, 170 are aligned, the protrusions 104 are inserted simultaneously into the recesses 144, so that an essential void-less or solid structure remains. With this simple connection procedure, a reliable electric connection between the contacts 106 and the contacts 146 is accomplished in several connection planes which are separated from one another in the vertical dimension 195.

As can be taken from FIG. 1, each of the protrusions 104 comprises a central pillar 108 and a tube 110 surrounding the pillar 108. Pillar 108 and tube 110 comprise the plurality of conductive male contacts 106 separated by electrically insulating material in between for electrically decoupling the electrically conductive male contacts 106 from one another. As can be taken from FIG. 1, the central pillar 108 of the protrusions 104 extends to a height which is larger than a height up to which the tubes 110 extend to thereby form a stepped tapering structure (compare FIG. 1).

Correspondingly, each of the recesses 144 comprises a central pillar-shaped recess portion 148 and a tube shaped recess portion 150 surrounding the pillar-shaped recess portion 148. Pillar-shaped recess portion 148 and tube shaped recess portion 150 extend into the main surface 170 of the female substrate 142 and laterally delimit the plurality of electrically conductive female contacts 146 and electrically insulating material of the female substrate 142 arranged for electrically decoupling the electrically conductive female contacts 146 from one another.

Since the central pillar-shaped recess portions 148 are designed to mate with the pillar portions 108 of the protrusions 104, also the central pillar-shaped recess portion 148 extends to a height which is larger than a height up to which the tube shaped recess portions 150 extend to thereby form a stepped tapering structure. Both the protrusions 104 as well as the recesses 144 are formed as a laminate structure which is simple and cheap in manufacture and allows for a proper connection.

In order to improve the adherence between the male connection piece 120 and the female connection piece 140, electrically conductive glue can be attached to the connection surface of the components 120, 140, particularly of the electrically conductive portions thereof. Additionally or alternatively, electrically insulting glue can be attached to the electrically insulating surface portions of the components 120, 140.

Figure 2:
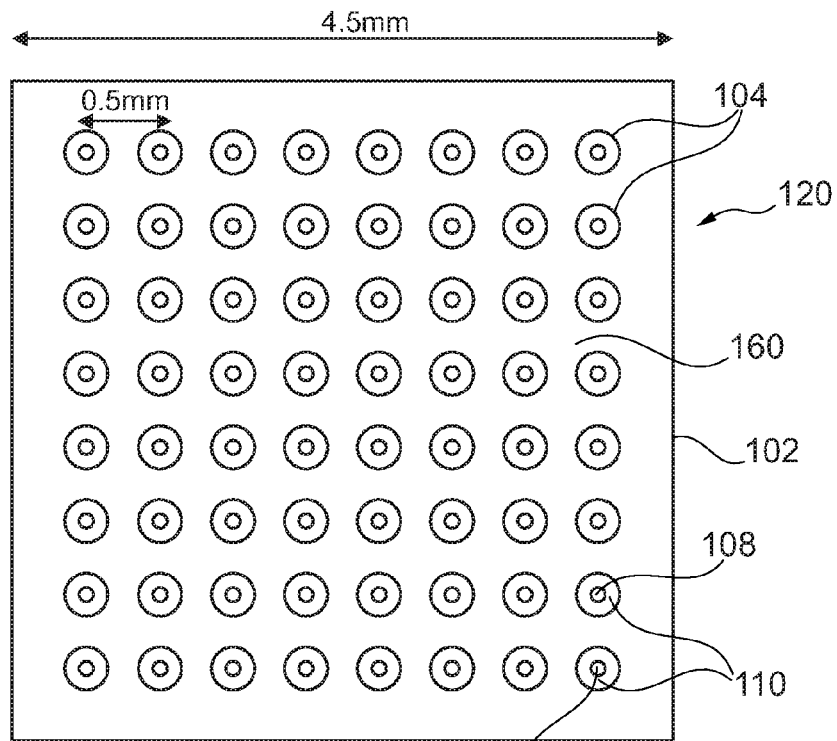
FIG. 2 shows a plan view of a male connection component according to an exemplary embodiment of the invention.

FIG. 2 shows a plan view of a male connection component 120 as shown in FIG. 1. As can be taken from FIG. 2, a pitch width between adjacent protrusions 104 is in the described embodiment 0.5 mm. A side length of the male substrate 102 is 4.5 mm. More generally, a pitch width may be, according to an exemplary embodiment, between 0.05 mm and 2 mm, particularly between 0.1 mm and 1 mm. A side length may be between 0.5 mm and 20 mm, particularly between 1 mm and 10 mm.

FIG. 2 shows an example of the maximum number of I/Os of a BGA package with 4.5×4.5 mm. This maximum number may be doubled by the described embodiment as compared to a conventional arrangement to 2*64=128 I/Os.

Figure 3:
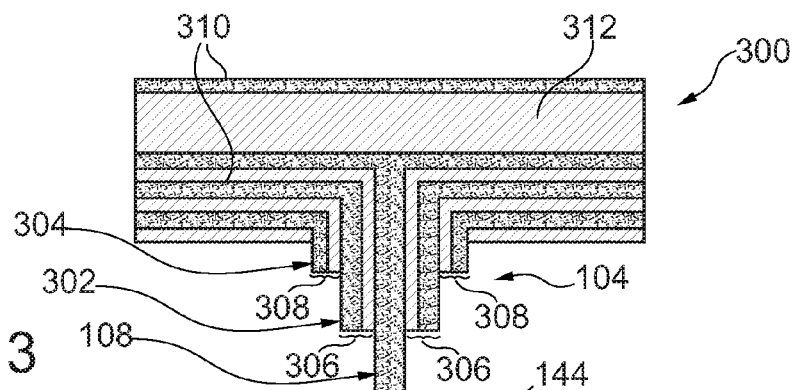
FIG. 3 shows a cross-section of a male connection component according to an exemplary embodiment of the invention.

FIG. 3 shows a package substrate/laminate arrangement 300 as a male connection component according to another exemplary embodiment.

In this embodiment, the protrusion 104 is formed by a central pillar 108 being made of a copper material to form a first level connection. A second level connection is provided by an electrically conductive contact 302 made of copper material, and a third level connection 304 is also made of a copper material. In the embodiment of FIG. 3, the protrusion 104 comprises the central pillar 108 as well as a first hollow cylindrical portion 306 and a second hollow cylindrical portion 308. Copper layers of laminate 310 are provided in a sandwich architecture with core layers 312 of laminate being made of an electrically insulating material.

Figure 4:
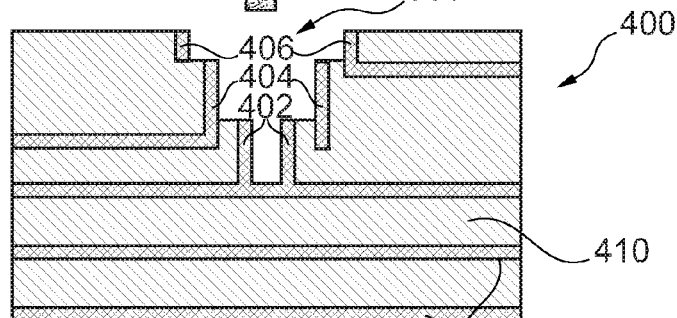
FIG. 4 shows a cross-section of a mating female connection component according to an exemplary embodiment of the invention.

Mating to the male connection component 300 is a female connection component 400 shown in FIG. 4 according to an exemplary embodiment of the invention.

FIG. 4 shows a printed circuit board of an application including a recess 144 correspond to mate to the protrusion 104 of FIG. 3. A first level connection element 402 is adapted to be contacted to the pillar 108, a second level connection element 404 is to be connected to the second level connection 302, and a third level connection component 406 delimited by the recess 144 is adapted to be contacted to the third level connection element 304 upon connecting the male connection component 300 with the female connection component 400. The lamination structure of FIG. 4 comprises copper layers 408 and core layers 410.

Figure 5:
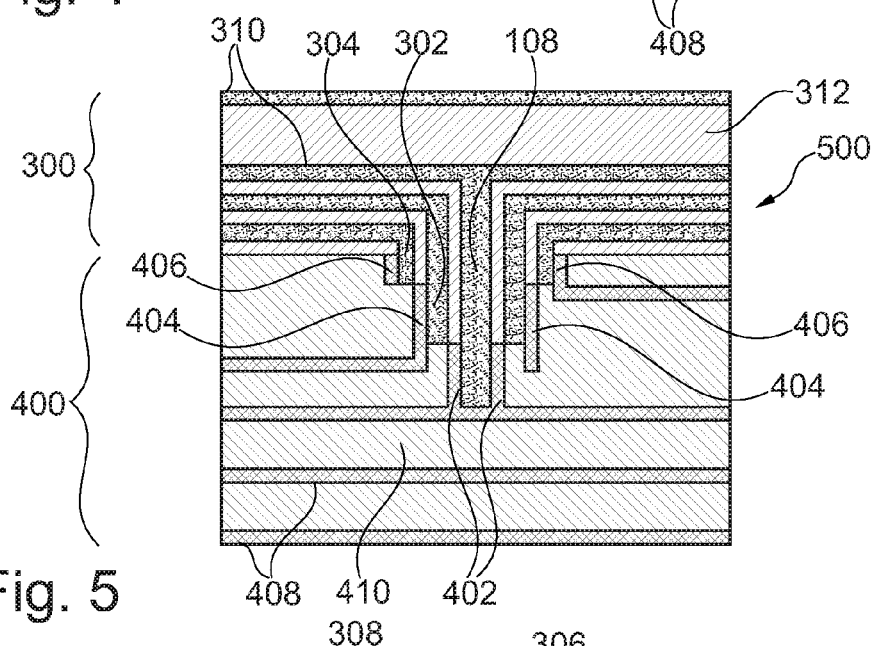
FIG. 5 shows the components of FIG. 3 and FIG. 4 connected to one another.

As shown in FIG. 5, after connecting the male connection component 300 with the female connection component 400, an electronic device 500 according to an exemplary embodiment of the invention will be obtained.

Hence, FIG. 3 and FIG. 4 show an example of multi level interconnection by copper pillar bumps/tubes, wherein package and PCB are shown before connection. FIG. 5 shows the package and the PCB connected. With this embodiment, one conventional connector location can be arranged at each of three levels to provide three connections. For example, 64 locations on the same array of an BGA64 can provide 192 connections.

Figure 6:
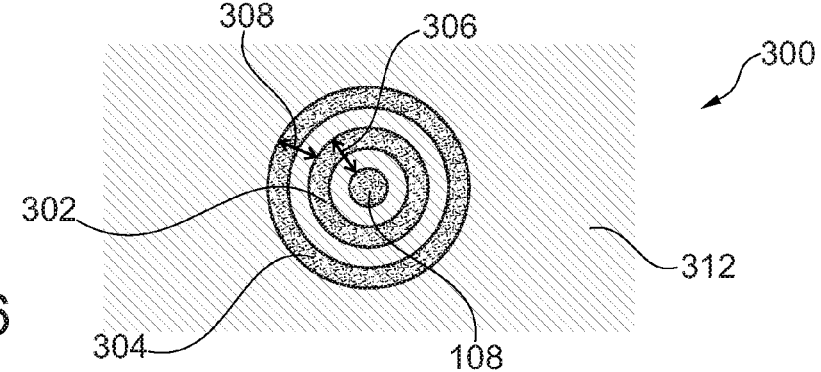
FIG. 6 shows a plan view of the male connection component of FIG. 3.

FIG. 6 shows a plan view of the male connection component 300 of FIG. 3.

Embodiments of the invention may provide a semiconductor multi level inter-connection.

Figure 7:
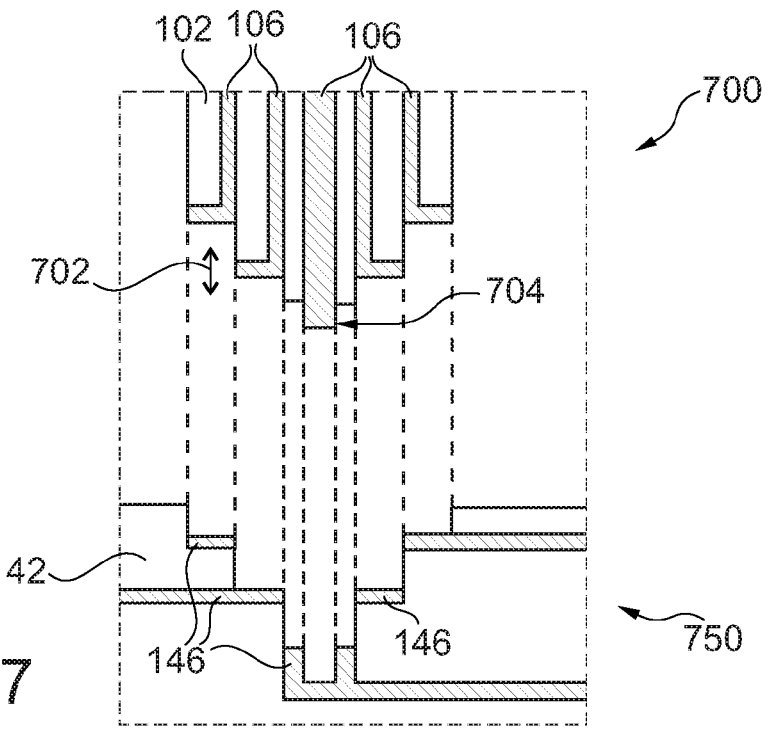
FIG. 7 shows a cross-section of a male connection component and of a mating female connection component according to an exemplary embodiment of the invention prior to assembly.

FIG. 7 shows a cross-section of a male connection component 700 and of a mating female connection component 750 according to an exemplary embodiment of the invention. Assembly of male connection component 700 and female connection component 750 can be performed by moving one of these components relative to the other one along dotted lines in FIG. 7. In the embodiment of FIG. 7, an electric contact can be achieved by a front or head side contact 702 and/or by a lateral or radial side contact 704.

Figure 8:
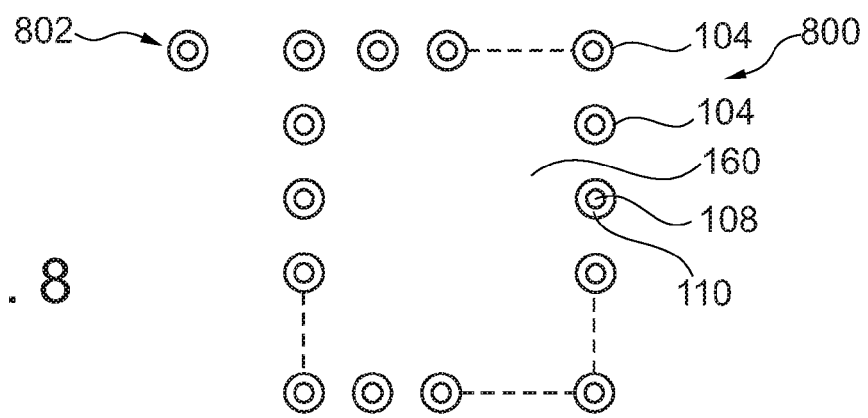
FIG. 8 shows a plan view of a male connection component according to an exemplary embodiment of the invention.

FIG. 8 shows a plan view 800 of a male connection component according to an exemplary embodiment of the invention. FIG. 8 furthermore shows an alignment marker 802 (such as a separate pin) arranged as a shape coding feature in such a manner that an erroneous assembly of male connection component and female connection component is prevented since only in a correct alignment, alignment marker 802 can engage a correspondingly shaped inverse alignment marker such as a groove (not shown) of the female connection component.

Figure 9:
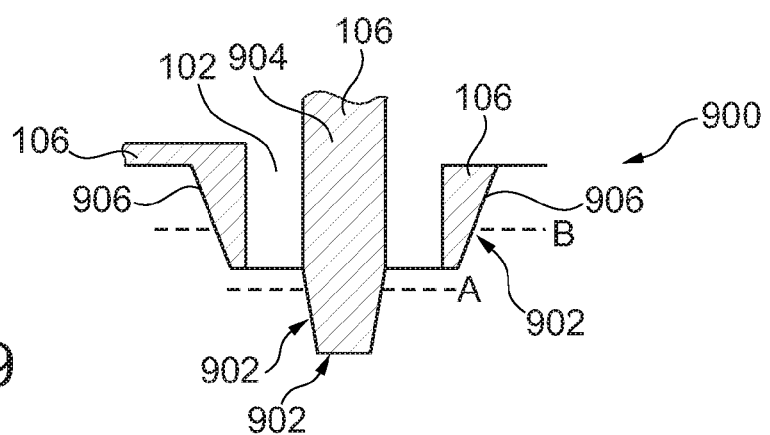
FIG. 9 shows a cross-section of a male connection component according to an exemplary embodiment of the invention.

FIG. 9 shows a cross-section of a male connection component 900 according to an exemplary embodiment of the invention. In FIG. 6, electrical connections 106 have a conically tapering protrusion shape which can be manufactured by appropriate etching techniques or the like. Such tapering portions 902 may further improve reliability of an electric contact, particularly when central protrusion 904 has a cylindrical portion with a (for instance only slightly) larger diameter than a corresponding matching female part (not shown) so that the corresponding matching female part sits at an upper portion A. Also surrounding protrusion 906 is then reliably contacted at a lower portion B.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. An apparatus comprising a circuit id and configured and arranged to operate in response to a circuit connection caused by mating of a male connection component with a correspondingly configured female connection component having a recess defined by a sidewall extending into a main surface of a female substrate of the female connection component, wherein the female connection component comprises a plurality of electrically conductive female contacts which are electrically decoupled from one another, are vertical and conductive and are arranged along the sidewall at different height levels with regard to the main surface of the female substrate, wherein the male connection component includes:
   a male substrate;
   a protrusion having a sidewall protruding from a main surface of the male substrate and comprising a plurality of electrically conductive male contacts along the sidewall of the protrusion and which are electrically decoupled from one another and are arranged at different height levels with regard to the main surface of the male substrate;
   wherein the male connection component is adapted for connection with the female connection component so that upon connection, each of the plurality of electrically conductive male contacts is brought in contact with one of the plurality of electrically conductive female contacts for providing electric contact at different height levels;
   wherein the male substrate forms at least part of one of a chip, a chip package and a circuit board; and
   wherein the protrusion comprises a plurality of electrically insulating structures, and a plurality of electrically conductive structures extending through the plurality of electrically insulating structures of the protrusion to respective ones of the conductive male contacts along the sidewall of the protrusion.

2. Male connection component according to claim 1, comprising a plurality, particularly an array, of protrusions each protruding from the main surface of the male substrate and each comprising a plurality of electrically conductive male contacts which are electrically decoupled from one another and are arranged at different height levels with regard to the main surface of the male substrate.

3. Male connection component according to claim 1, wherein the protrusion comprises a central pillar and at least one tube surrounding the pillar, the central pillar and the at least one tube protruding from the main surface of the male substrate and comprising the plurality of electrically conductive male contacts and electrically insulating material for electrically decoupling different ones of the electrically conductive male contacts from one another.

4. Male connection component according to claim 3, wherein the central pillar extends to a height which is larger than a height up to which the at least one tube extends to thereby form a tapering protrusion, particularly a stepped tapering protrusion.

5. Male connection component according to claim 1, wherein the male substrate forms at least part of a wafer level chip scale package for packaging a semiconductor chip.

6. The male connection component according to claim 1, wherein the plurality of electrically conductive structures include, for each conductive male contact, an electrically conductive structure that includes a vertical portion extending vertically from the main surface of the male substrate to the height level at which the conductive male contact is located, and a lateral portion that extends laterally from the vertical portion at the height level to the sidewall at which the conductive male contact is located.

7. A female connection component for connection with a correspondingly configured male connection component having a protrusion including sidewalls that face one another and that protrude from a main surface of a male substrate of the male connection component, wherein the male connection component comprises a plurality of electrically conductive male contacts which are along the sidewalls, electrically decoupled from one another and are arranged at different height levels with regard to the main surface of the male substrate, the female connection component comprising
a female substrate;
a recess including sidewalls facing one another, extending into a main surface of the female substrate and delimiting a plurality of electrically conductive female contacts of the female substrate which are electrically decoupled from one another and are arranged along the sidewalls at different height levels with regard to the main surface of the female substrate;
wherein the female connection component is adapted for connection with the male connection component so that upon connection, each of the plurality of electrically conductive male contacts is brought in contact with one of the plurality of electrically conductive female contacts for providing electric contact at different height levels;
wherein the female substrate forms at least part of one of a circuit board, a chip, and a chip package; and
wherein the female substrate comprises a plurality of electrically conductive structures and a plurality of electrically insulating structures.

8. Female connection component according to claim 7, comprising a plurality, particularly an array, of recesses each extending into the main surface of the female substrate and each delimiting a plurality of electrically conductive female contacts of the female substrate which are electrically decoupled from one another and are arranged at different height levels with regard to the main surface of the male substrate.

9. Female connection component according to claim 7, wherein the recess comprises a central pillar-shaped recess portion and at least one tube-shaped recess portion surrounding the pillar-shaped recess portion, the central pillar-shaped recess portion and the at least one tube-shaped recess portion extending into the main surface of the female substrate and delimiting the plurality of electrically conductive female contacts and electrically insulating material of the female substrate for electrically decoupling the electrically conductive female contacts from one another.

10. Female connection component according to claim 9, wherein the central pillar-shaped recess portion extends to a height which is larger than a height up to which the at least one tube-shaped recess portion extends to thereby form a tapering recess, particularly a stepped tapering recess.

11. Female connection component according to claim 7, wherein the female substrate comprises a plurality of electrically conductive structures and a plurality of electrically insulating structures and is formed by lamination.

12. Female connection component according to claim 7, wherein the female substrate forms at least part of a printed circuit board for receiving a semiconductor chip.

13. An electronic apparatus, the electronic apparatus comprising:
a female connection component according to claim 7;
a male connection component comprising:
a male substrate; and
a protrusion protruding from a main surface of the male substrate and comprising a plurality of electrically conductive male contacts which are electrically decoupled from one another and are arranged at different height levels with regard to the main surface of the male substrate;
wherein the male connection component is adapted for connection with the female connection component so that upon connection, each of the plurality of electrically conductive male contacts is brought in contact with one of the plurality of electrically conductive female contacts for providing electric contact at different height levels;
wherein the male substrate forms at least part of one of a chip, a chip package and a circuit board;
wherein the male connection component is connected with the female connection component; and
wherein one of the male substrate and the female substrate forms at least part of the chip or the chip package, and the other one of the male substrate and the female substrate forms at least part of the circuit board.

14. Electronic apparatus according to claim 13, comprising electrically conductive glue in a connection portion between the protrusion and the recess.

15. Electronic apparatus according to claim 13, adapted as a portable device.

16. The female connection component according to claim 7, wherein the recess comprises:
a sidewall configured and arranged to accept and interface with sidewalls of the protrusion upon insertion of the protrusion into the recess,
a plurality of electrically insulating structures, and
a plurality of electrically conductive structures extending vertically and laterally through the plurality of electrically insulating structures of the recess to respective ones of the conductive female contacts at a surface of the sidewall.

17. The female connection component according to claim 8, wherein the plurality of electrically conductive female contacts includes, for each conductive female contact, an electrically conductive structure that includes a vertical portion extending vertically to the height level at which the conductive female contact is located, and a lateral portion that extends laterally from the vertical portion at the height level to the sidewall at which the conductive female contact is located.

18. A method of connecting a male connection component with a female connection component, the method comprising
providing the male connection component with a male substrate and a protrusion protruding from a main surface of the male substrate and comprising a plurality of electrically conductive male contacts which are electrically decoupled from one another and are arranged at different height levels with regard to the main surface of the male substrate;
providing the female connection component with a female substrate and a recess extending into a main surface of the female substrate and delimiting a plurality of electrically conductive female contacts of the female substrate which are electrically decoupled from one another and are arranged at different height levels with regard to the main surface of the female substrate, wherein the female substrate comprises a plurality of electrically conductive structures and a plurality of electrically insulating structures and is formed by lamination wherein the plurality of electrically conductive female contacts includes, for each conductive female contact, an electrically conductive structure that includes a vertical portion extending vertically to the height level at which the conductive female contact is located, and a lateral portion that extends laterally from the vertical portion at the height level to the sidewall at which the conductive female contact is located;
connecting the male connection component with the female connection component so that upon connection, each of the plurality of electrically conductive male contacts is brought in contact with one of the plurality of electrically conductive female contacts for providing electric contact at different height levels; and
wherein one of the male substrate and the female substrate forms at least part of a chip or a chip package, and the other one of the male substrate and the female substrate forms at least part of a circuit board.

19. The method of claim 18, wherein
providing the male connection component includes providing the protrusion with sidewalls that face one another and with at least one of the electrically conductive male contacts including a contact extending laterally to a surface of one of the sidewalls,
providing the female connection component includes providing the recess with sidewalls facing one another and defining the recess, the sidewalls being configured and arranged to interface with the sidewall of the male connection component upon insertion of the protrusion into the recess, and wherein the electrically conductive female contacts include a contact extending laterally to a surface of the sidewall and configured and arranged to interface with the at least one of the electrically conductive male contacts, and
connecting the male connection component with the female connection component includes connecting the respective contacts extending laterally to the sidewalls of the protrusion and recess, respectively.

20. The method of claim 18, wherein connecting the male connection component with the female connection component includes
providing the female connection component at a temperature that is above a temperature of the male connection component, and
communicatively coupling the contacts of the male connection components to the contacts of the female connection components via a solderless connection by inserting the male connection component into the female connection component and thereafter, allowing the temperature of the male and female connection components to equilibrate.

* * * * *